(12) United States Patent
Buchwalter et al.

(10) Patent No.: US 8,963,020 B2
(45) Date of Patent: Feb. 24, 2015

(54) PROCESS FOR MAKING STUBLESS PRINTED CIRCUIT BOARDS

(71) Applicant: International Business Machines Corporation, Armonk, NY (US)

(72) Inventors: Stephen L. Buchwalter, Hopewell Junction, NY (US); Russell Alan Budd, North Salem, NY (US)

(73) Assignee: International Business Machines Corporation, Armonk, NY (US)

( * ) Notice: Subject to any disclaimer, the term of this patent is extended or adjusted under 35 U.S.C. 154(b) by 158 days.

(21) Appl. No.: 13/835,044

(22) Filed: Mar. 15, 2013

(65) Prior Publication Data

US 2013/0223030 A1    Aug. 29, 2013

Related U.S. Application Data

(62) Division of application No. 12/176,615, filed on Jul. 21, 2008, now Pat. No. 8,404,981, which is a division of application No. 11/405,405, filed on Apr. 18, 2006, now Pat. No. 7,404,251.

(51) Int. Cl.
| | |
|---|---|
| *H01K 3/10* | (2006.01) |
| *H05K 1/11* | (2006.01) |
| *H05K 1/02* | (2006.01) |
| *H05K 3/42* | (2006.01) |
| *H05K 1/18* | (2006.01) |
| *H05K 3/32* | (2006.01) |
| *H05K 3/02* | (2006.01) |

(52) U.S. Cl.
CPC .............. *H05K 1/0298* (2013.01); *H05K 3/429* (2013.01); *H05K 1/181* (2013.01); *H05K 3/32* (2013.01); *H05K 1/0237* (2013.01); *H05K 3/027* (2013.01); *H05K 2201/09845* (2013.01); *H05K 2203/0242* (2013.01); *H05K 2203/175* (2013.01)
USPC ............................................ 174/262; 29/853

(58) Field of Classification Search
USPC .......................... 174/262–266; 361/792–795; 29/852–853
See application file for complete search history.

(56) References Cited

U.S. PATENT DOCUMENTS

| | | | |
|---|---|---|---|
| 3,596,202 | A | 7/1971 | Patel |
| 4,975,142 | A | 12/1990 | Iannacone et al. |
| 5,479,703 | A | 1/1996 | Desai et al. |
| 6,212,769 | B1 | 4/2001 | Boyko et al. |
| 6,233,820 | B1 | 5/2001 | Hummelink et al. |
| 6,359,850 | B1 | 3/2002 | Chung et al. |
| 6,391,210 | B2 | 5/2002 | Appelt et al. |
| 6,775,907 | B1 | 8/2004 | Boyko et al. |
| 2002/0195716 | A1 | 12/2002 | Magnuson et al. |
| 2003/0209799 | A1 | 11/2003 | Magnuson et al. |

(Continued)

*Primary Examiner* — Jeremy C Norris
(74) *Attorney, Agent, or Firm* — Novak Druce Connolly Bove + Quigg LLP; Daniel P. Morris, Esq.

(57) ABSTRACT

A process of copper plating a through-hole in a printed circuit board, and the printed circuit board made from such process. The process comprises: providing a printed circuit board with at least two copper interconnect lines separated by an insulator in the vertical direction; providing a through-hole in the printed circuit board in the vertical direction such that the interconnect lines provide a copper land in the through-hole; applying a seed layer to an interior surface of the through-hole; removing an outermost portion of the seed layer from the interior surface of the through-hole with a laser; applying copper on the seed layer.

15 Claims, 7 Drawing Sheets

(56) References Cited

U.S. PATENT DOCUMENTS

| 2005/0023699 | A1 | 2/2005 | Ahn et al. |
| 2005/0064707 | A1 | 3/2005 | Sinha |
| 2005/0103524 | A1 | 5/2005 | Naito et al. |
| 2005/0128672 | A1 | 6/2005 | Tourne et al. |
| 2005/0251997 | A1 | 11/2005 | Homg et al. |
| 2008/0047744 | A1 | 2/2008 | Takada |

# PROCESS FOR MAKING STUBLESS PRINTED CIRCUIT BOARDS

CROSS REFERENCE TO RELATED APPLICATIONS

This application is a Divisional of co-pending application Ser. No. 12/176,615, filed on Jul. 21, 2008. Application Ser. No. 12/176,615 is a Divisional of application Ser. No. 11/405,405, filed on Apr. 18, 2006, now U.S. Pat. No. 7,404,251, the entire disclosures of which are herein incorporated by reference in their entireties.

TECHNICAL FIELD

This disclosure is directed to a process of making printed circuit boards by removing select portions of seed layer by laser ablation, and to printed circuit boards made by the process.

BACKGROUND

Printed circuit boards (PCBs) are widely used to hold and electrically connect selected electronic components. Printed circuit boards are comprised of copper electrical interconnects separated by levels of insulating dielectric materials. In the horizontal xy plane, the copper interconnect lines are patterned on each of the individual layers and the layers joined to form a composite. Through-holes are then drilled in the vertical z direction from top to bottom of the composite, passing through each layer of the composite as well as through the copper landing pads on the layers to which electrical connection is required. A seed layer followed by one or more copper layers is then applied to the interior surface of the drilled through-holes.

A conventional method of manufacturing PCBs is depicted in FIG. 1, and consists of the following steps: 1) sub-laminates of epoxy pre-impregnated glass cloth (prepreg) are designed and prepared with copper interconnect lines on both sides of the prepreg, and the sub-laminates compiled with as many layers of signal, power and ground as are needed and joined together at elevated temperature and pressure, FIG. 1(a); 2) through-holes 10 are mechanically drilled through the PCB 12, FIG. 1(b) (internal surface features of through-hole not shown); 3) a seed layer 14 is applied to the surface of the PCB and the interior surfaces of the through-holes, FIG. 1(c); 4) a thin "plating base" of electroless copper 16 is applied to the seed layer 14, FIG. 1(d); 5) photoresist 18 is applied and patterned on the external surfaces of the PCB, FIG. 1(e); 6) copper 20 is electroplated using the plating base as an electrical common layer, FIG. 1(f); and 7) the photoresist 18 is stripped and the exposed plating base is removed by etching, FIG. 1(g).

Following the stripping of the photoresist, the thin copper layer that had been protected by the photoresist is etched away to form a copper interconnect pattern on the external surfaces of the PCB, and leaving plated through-holes with a conducting copper layer on most, if not all, of the interior surface of the through-holes. Thus, regardless of which two copper interconnect layers in the PCB are associated with the through-hole, the copper is present throughout the hole, i.e. from top to bottom of the PCB as well as extra copper 30 (copper stubs) at the through-holes, which are known to have detrimental effects on signal integrity.

The PCB is designed to connect any one copper interconnect line for any prepreg layer to another copper interconnect line of another prepreg layer via a plated through-hole. However, because the plated through-holes are formed after the multilayer structure is assembled, there are extraneous copper stubs 30 at the top and/or the bottom of the plated through-hole as explained above. These extraneous copper stubs 30 limit the electrical performance of the copper interconnection especially at high frequency, and therefore, they often need to be removed. A typical process for removing the copper stubs involves redrilling or "backdrilling" the plated through-hole to remove the extraneous and undesired copper to provide a backdrilled PCB as shown in FIG. 2.

The backdrilling process is time consuming, expensive and subjects the PCB to unnecessary damage, which affects the production yield. First, the process is time consuming because each through-hole must be carefully drilled only to a limited depth which varies from hole-to-hole. Second, the back drilling leaves a portion 32 of the stub 30 as part of the allowed tolerance related to drill depth. Third, some of the PCBs are damaged by the backdrilling and have to be discarded.

SUMMARY OF THE DISCLOSURE

The invention is directed to a process of copper plating a through-hole in a printed circuit board. The process comprises providing a printed circuit board with at least two copper interconnect lines separated by an insulator in the vertical direction. The printed circuit board also includes a through-hole in the vertical direction such that the interconnect lines provide a copper land in the through-hole. A seed layer is then applied to an interior surface of the through-hole. An outermost portion of the seed layer is then removed from the interior surface of the through-hole with a laser. The process also includes applying copper on the seed layer.

The invention is also directed to a printed circuit board. The printed circuit board comprises at least two embedded copper interconnect lines separated by an insulator in the vertical direction. Also, each of the at least two interconnect lines intersect a common through-hole. The printed circuit board also includes an inner seed layer disposed on an interior surface of the through-hole from one of the interconnect lines to the other. The insulator diameter of the through-hole proximate to an external planar surface of the printed circuit board is substantially equal to the insulator diameter of the through-hole between the at least two interconnect lines. The printed circuit board also includes an outermost surface of the through-hole proximate to the external planar surface that consists essentially of an insulating surface.

In an alternative embodiment, a printed circuit board comprises at least one embedded copper interconnect line and at least one external copper interconnect line disposed within an external insulating layer. Also, each of the embedded interconnect line and the external interconnect line intersect a common through-hole. The printed circuit board also includes an inner seed layer disposed in the common through-hole from the embedded interconnect line to the external interconnect line, and an opposite external insulating layer. The insulator diameters of the through-hole of both external insulating layers are substantially equal to the insulator diameter of the through-hole between the embedded and external two interconnect lines. Again, the printed circuit board includes an outermost surface of the through-hole proximate to the opposite external insulating layer that consists essentially of an insulating surface.

In yet another embodiment, a printed circuit board comprises at least one embedded copper interconnect line and at least one external copper interconnect line disposed within an external insulating layer. Again, the embedded interconnect line and the external interconnect line intersect a common through-hole. The printed circuit board also includes an inner seed layer disposed in the common through-hole from the embedded interconnect line to the external interconnect line, and an opposite external insulating layer. The insulator diameter of the through-hole of said opposite external insulating layer is substantially greater than the insulator diameter of the through-hole between the embedded interconnect line and external interconnect line. Again, the printed circuit board includes an outermost surface of the through-hole proximate to the opposite external insulating layer that consists essentially of an insulating surface.

The invention is also directed to ar process of copper plating a through-hole in a printed circuit board. The process comprises providing a printed circuit board with at least two copper interconnect lines separated by an insulator in the vertical direction. The printed circuit board also includes a through-hole in the vertical direction such that the at least two interconnect lines provide a copper land in the through-hole. A portion of an external insulating layer about the circumferential region of the through-hole is then removed, and a seed layer is applied to an interior surface of the through-hole. An outermost portion of the seed layer is then removed from the interior surface of the through-hole with a laser; and copper is applied to the seed layer.

BRIEF DESCRIPTION OF THE DRAWINGS

These and other features of the present invention will become apparent upon consideration of the following detailed description of the invention when read in conjunction with the drawings, in which.

DETAILED DESCRIPTION OF THE DISCLOSURE

Figure 1A:
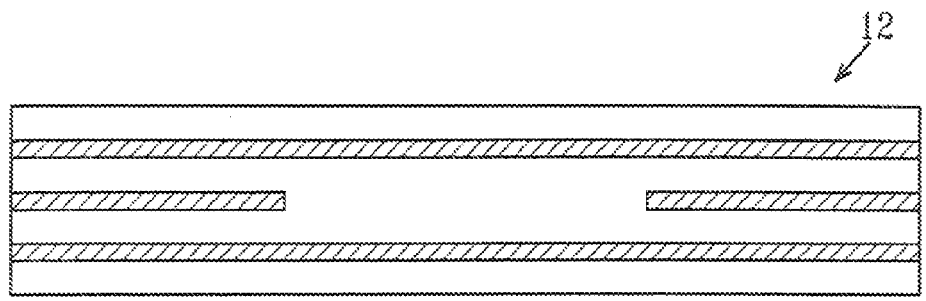
FIGS. 1(a) to 1(g) is a schematic representation of a conventional process for manufacturing a PCB.
Figure 1B:
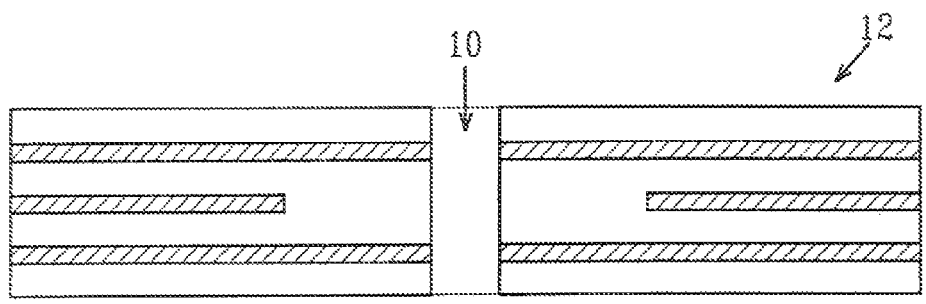
Figure 1C:
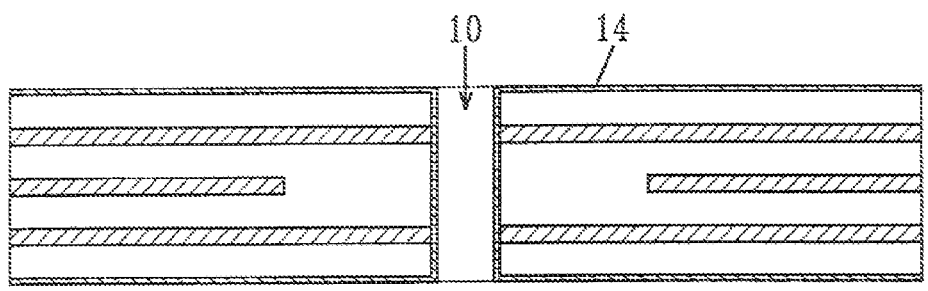
Figure 1D:
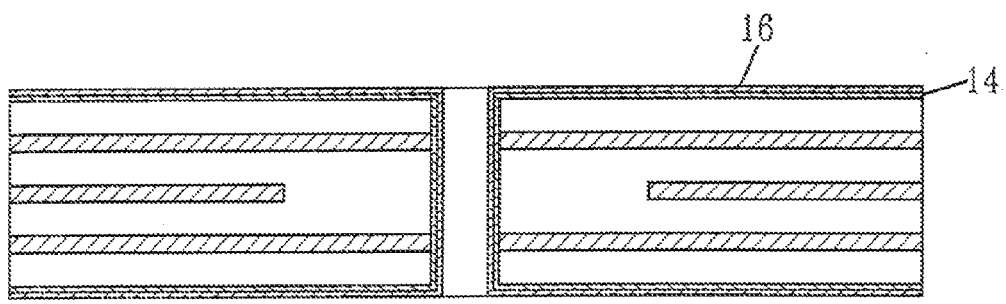
Figure 1E:
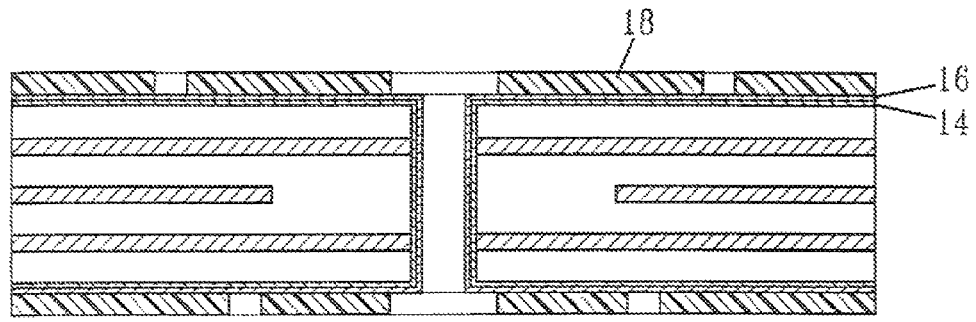
Figure 1F:
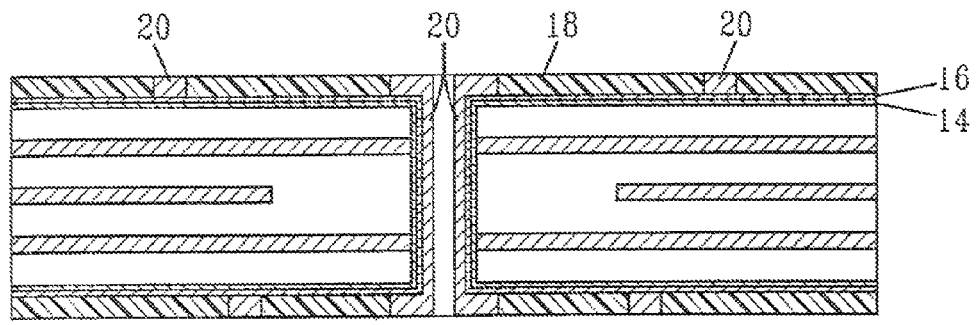
Figure 1G:
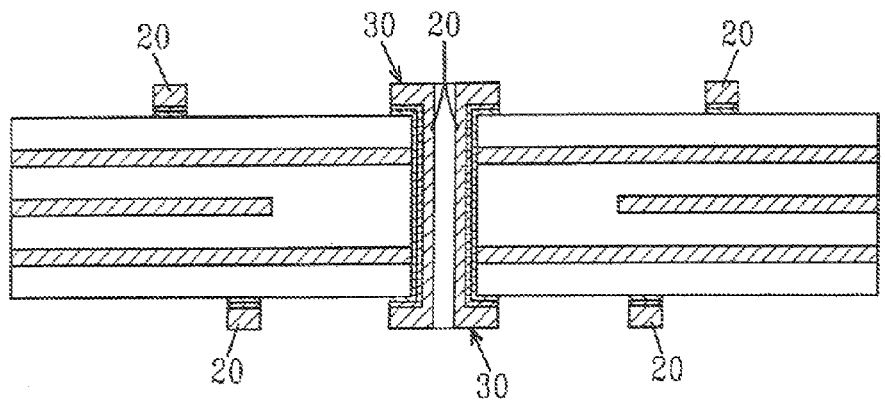
Figure 2:
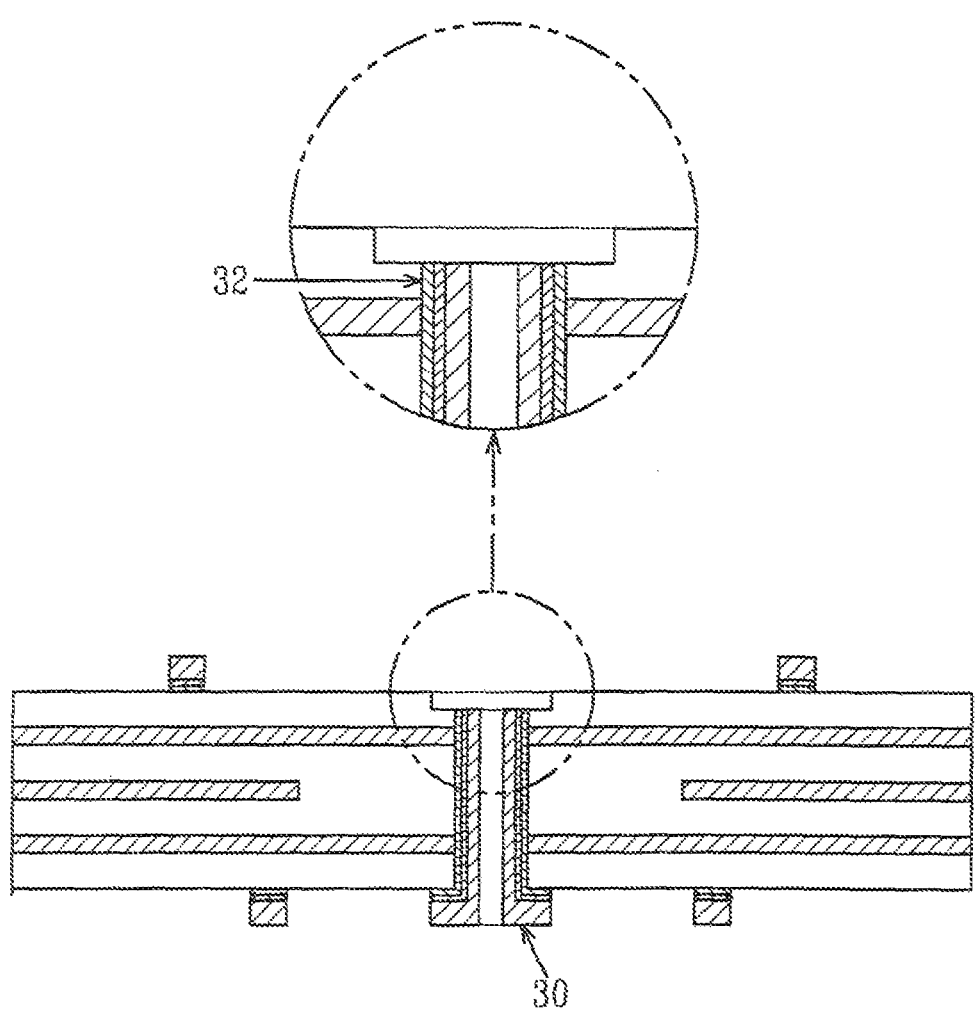
FIG. 2 is a schematic representation of a PCB with a portion of a copper stub removed by mechanical back drilling.

The disclosure is directed to a process of copper plating a through-hole in a printed circuit board. The process comprises providing a printed circuit board (PCB) with at least two copper interconnect lines separated by an insulator in the vertical direction, and providing a through-hole in the PCB in the vertical direction such that the interconnect lines provide a copper land in the through-hole. A seed layer is then applied to an interior surface of the through-hole. An outermost portion of the seed layer is then removed from the interior surface of the through-hole with a laser. Copper is then applied to the seed layer. The term vertical direction refers to the cross-sectional direction through the PCB, i.e., from the top external planar surface to the opposite (bottom), external planar surface of the PCB.

The step of applying copper can include an electroless process to form a first copper layer on the interior surface of the through-hole. The electroless copper deposits primarily on the remaining seed layer, thus leaving the outermost surface portion of the through-hole consisting essentially of an insulating surface. A second copper layer can then be applied on the first copper layer by electrolytic plating. The process of applying the copper can also include providing an electrical contact for electrolytic plating of the buried vias by exposing the interior planes at the edge of the panel in the kerf area that is normally removed during PCB finishing.

One of ordinary skill in the art would understand that the process of the invention includes the laser processing of at least one side of the through-hole, thus minimizing copper stubs on at least one side of the PCB. Alternatively, the process includes the laser processing of both the top and bottom regions of the through-holes, thus minimizing copper stubs on both sides of the PCB. The outermost portions of the seed layer that are removed from the through-hole extend from an external planar surface of the printed circuit board to the copper land of one of the at least two interconnect lines and from an opposite external planar surface of the PCB to the copper land of another interconnect line positioned in the through-hole.

In many applications of the process, the outermost portion of the seed layer removed from the through-hole extends from an external planar surface of the printed circuit board to the copper land of one of the at least two copper interconnect lines. In other applications, outermost portions of the seed layer removed from the through-hole extends from an external planar surface of the PCB to the copper land of one of the at least two interconnect lines, and from an opposite external planar surface of the printed circuit board to the copper land of another interconnect line positioned in the through-hole. The term "outermost" refers to regions proximate to the external surface of the PCB board. As a result, the term "outermost portion of the seed layer" refers to the portion of the seed layer proximate to an external surface of the PCB board.

Figure 3A:
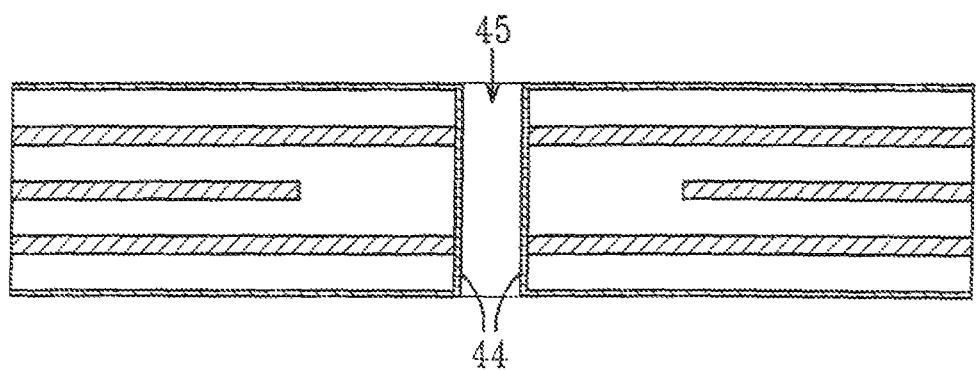
FIGS. 3(a) to 3(c) is a schematic representation of a process of the invention.
Figure 3B:
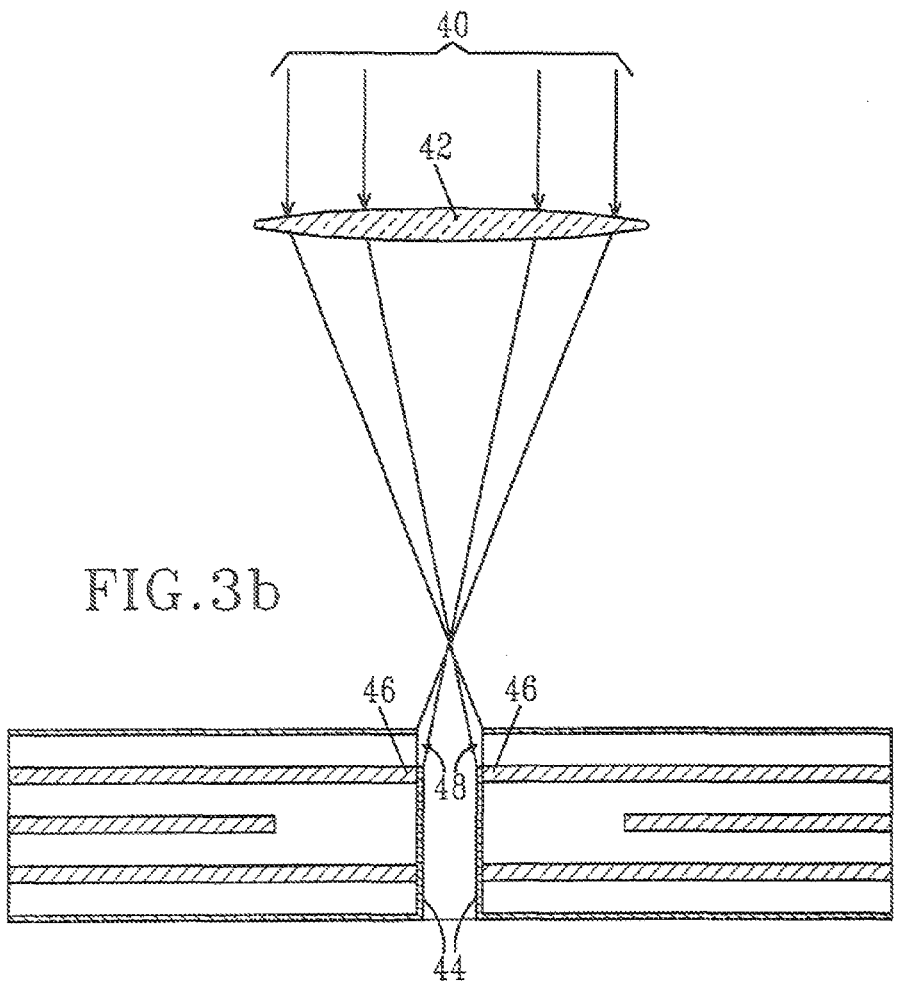
Figure 3C:
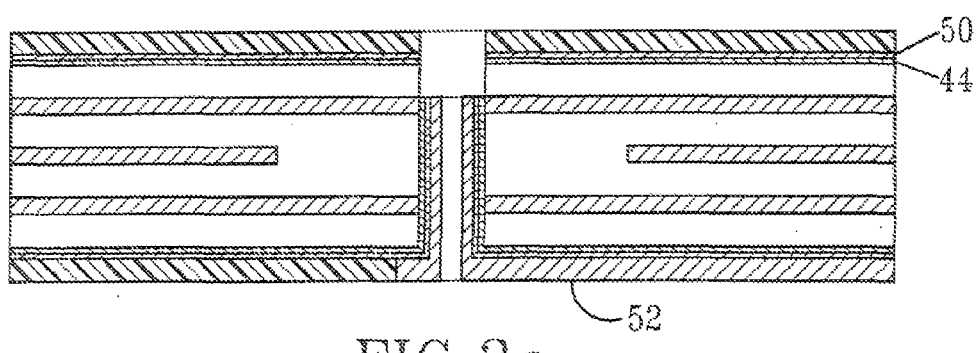

One advantage to the process is that many of the copper stubs that form during conventional copper plating of through-holes are minimized or eliminated altogether. Thus, the process provides a design opportunity to eliminate most, if not all, of the copper stubs, and therefore, eliminate or minimize the need for back drilling of the through-holes The process depends on the laser ablation of a deposited seed layer from outermost portions of the interior surface of one or more through-holes, FIGS. 3(a) to 3(c). One type of laser that can be used in the process is a laser 40 with a catadiopotic lens 42. Following the deposition of the seed layer 44, e.g., by dip coating, the laser 40 is used to remove the outermost portions 48 of seed layer from an interior surface of the through-hole 45, FIG. 3(b). The copper lands 46 in the interior surface of the through-hole serve as an effective etch stop for the removal of the seed layer 44 with the laser. Once the outermost portion 48 of seed layer 44 is removed with the laser, the copper plating process can continue. However, because of the removal of seed layer 44 from the outer most portion 48 of the through-hole 45, little, or no, copper 50 is deposited in these regions by the electroless process, and thus, copper 52 will also not electroplate in these regions, FIG. 3(c). As a result, the process of the invention eliminates the need for backdrilling a copper stub in those regions of the through-hole contacted by the laser.

It is to be understood that the process of the invention can be used in combination with the conventional backdrilling process to provide a finished PCB with no copper stubs. The inventive process does not necessarily rule out use of the conventional backdrilling process. For example, the process of the invention can still include the formation of copper stubs that are then removed by backdrilling, and the inventive process can be used to minimize the amount of backdrilling that is required.

In another example, the process of the invention can include removing a portion of an external insulating layer about the circumferential region of a through-hole prior to applying a seed layer. The removal of the external insulating layer can be accomplished by drilling the outermost portion of the through-hole effectively enlarging the outer circumference of the through-hole.

In another embodiment, the process includes providing a PCB with at least two copper interconnect lines separated by an insulator in the vertical direction, and providing a through-hole in the PCB in the vertical direction such that the at least two interconnect lines provide a copper land in the through-hole. A portion of an external insulating layer about the circumferential region of the through-hole is then removed, and a seed layer is applied to an interior surface of the through-hole. The external insulating layer can be removed by back-drilling to form a recessed through-hole. An outermost portion of the seed layer is then removed from the interior surface of the through-hole with a laser, and copper is applied to the seed layer. This process is useful if the interior landing pad is located deeper into the through-hole where it will be difficult to selectively remove the catalyst from the interior surfaces without a greater diameter opening at the external surface of the though hole.

Again, applying copper can include an electroless process to form a first copper layer on the interior surface of the through-hole followed by applying a second copper layer on the first copper layer.

Figure 4A:
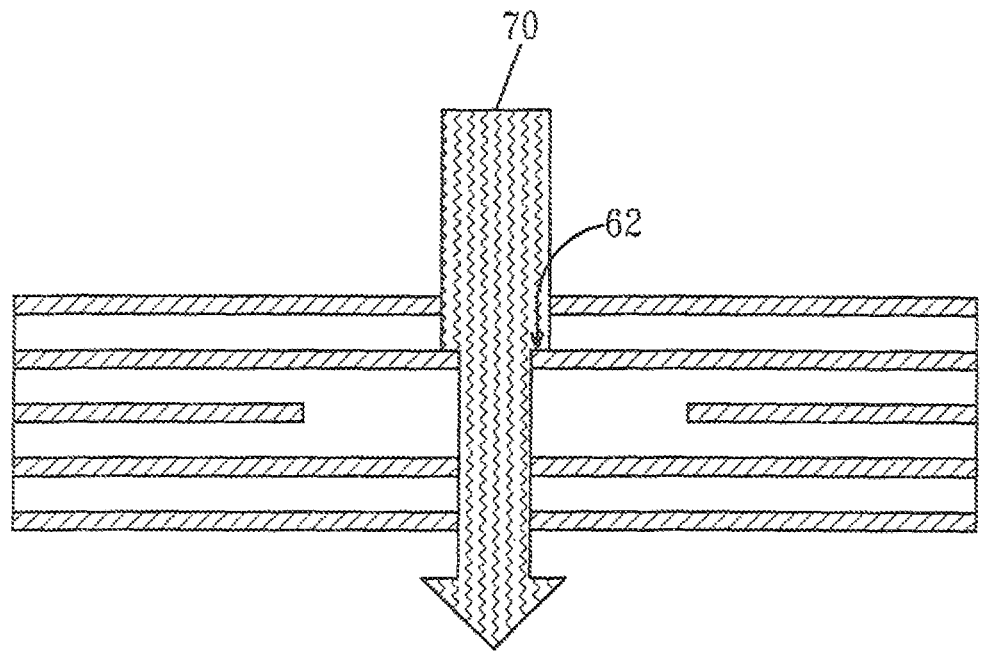
FIGS. 4(a) to 4(c) is a is a schematic representation of another process of the invention.
Figure 4B:
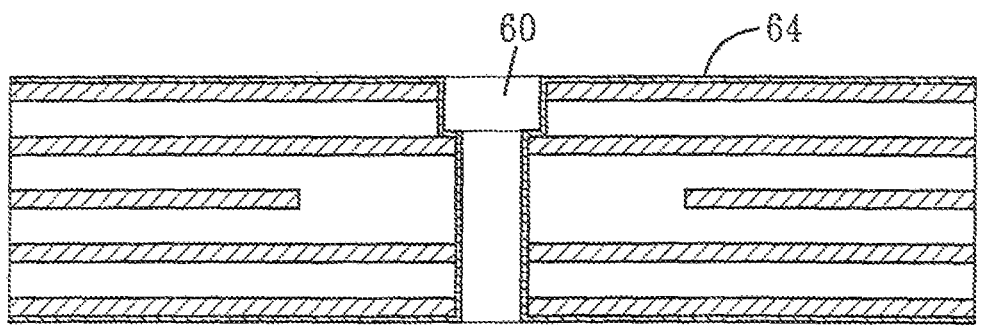
Figure 4C:
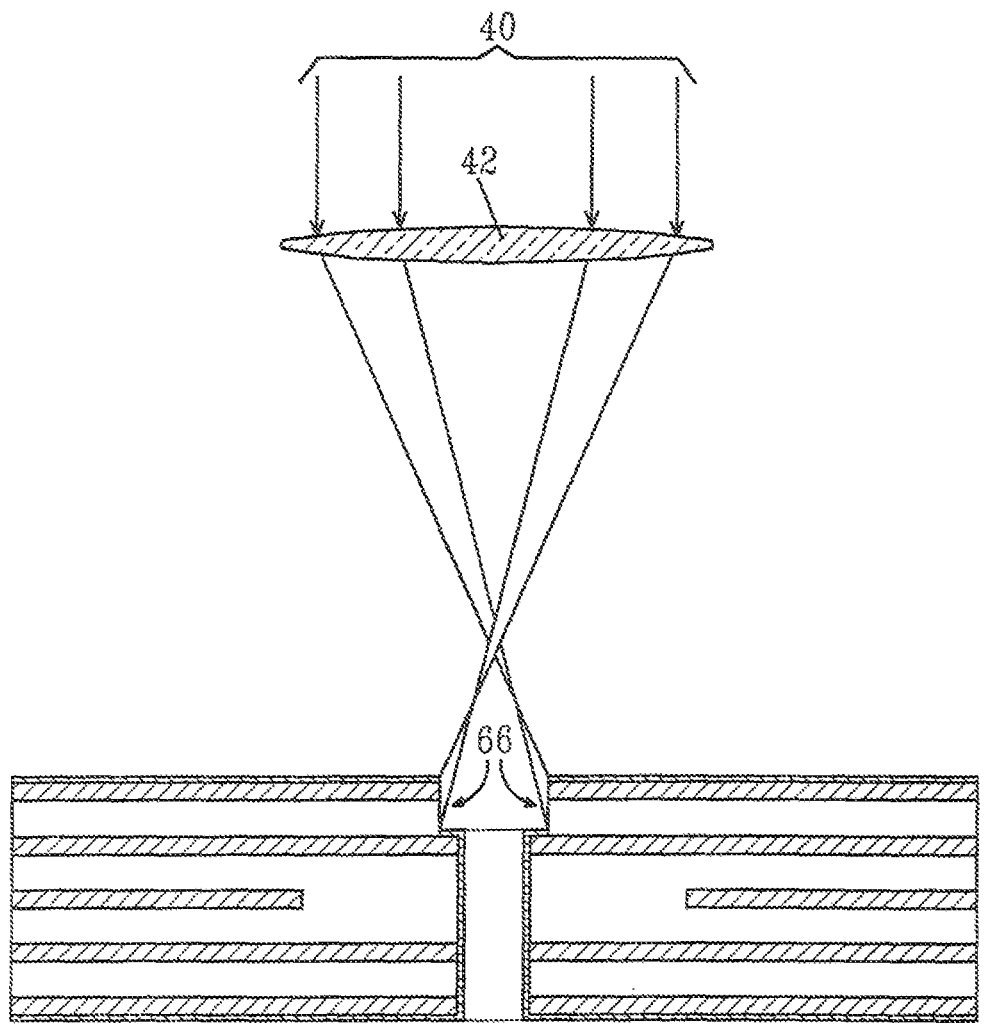

In another embodiment of the invention, the process includes two different laser ablation steps, FIGS. 4(a) to 4(c). The first laser step is used to increase the diameter of the through-hole 60 to an interior copper landing pad 62 prior to the deposition of the seed layer 64, FIGS. 4(a) and 4(b). The absence of the seed layer eliminates the possibility of scattering seed particles during the first laser ablation step that could lead to electroless plating in undesired regions. A high power laser 70, e.g., a CO2 laser, can be used in this step. Following application of the seed layer 64, FIG. 4(b), the second laser ablation step is used to selectively remove outermost portions 66 of the seed layer 64 as already described from the interior surface of the through-hole to the interior landing pad, FIG. 4(c). This process is useful if the interior landing pad is located relatively deep in the interior of the through-hole where it will be difficult to selectively remove the catalyst from the interior surfaces without a greater diameter opening at the external surface of the through-hole.

These new processes have a number of advantages over the state-of-the-art process of back drilling. First, because the landing pad of the interior interconnect line provides a built-in etch stop for the laser ablation, the process is more precise than the back drilling operation and with no residual copper stubs, higher overall yield and lower cost. Second, because it occurs earlier in the fabrication sequence, any yield detractors introduced by the step are less costly. Third, laser ablation tools are now very fast and completely programmable, allowing faster throughput than for back drilling. Fourth, this process enables efficient fabrication of vias interconnecting interior planes, using so-called buried vias.

The invention is also directed to a PCB comprising at least two embedded copper interconnect lines 80 and 80' separated by an insulator layer 81 in the vertical direction such that each of the two interconnect lines intersect a common through-hole 82. The PCB also includes a seed layer 84 disposed on an interior surface of the through-hole between the two interconnect lines 80 and 80', FIG. 5. The insulator diameter of the through-hole proximate to an external planar surface of the PCB is substantially equal to the insulator diameter of the through-hole 82 between the two interconnect lines 80 and 80', and an outermost interior surface 87 of the through-hole proximate to the external planar surface 85 of the PCB. The outermost interior surface 87 consists essentially of an insulating surface. In other words, the outermost surface of the through-hole will have negligible amounts of seed layer, and therefore subsequent copper layers 90 and 92 will not form in these regions. These structures differ from those fabricated by back drilling because, in the case of back drilling, the through-hole diameter of the back-drilled portion is substantially larger than the diameter between the embedded copper interconnect lines 80 and 80'.

Figure 5:
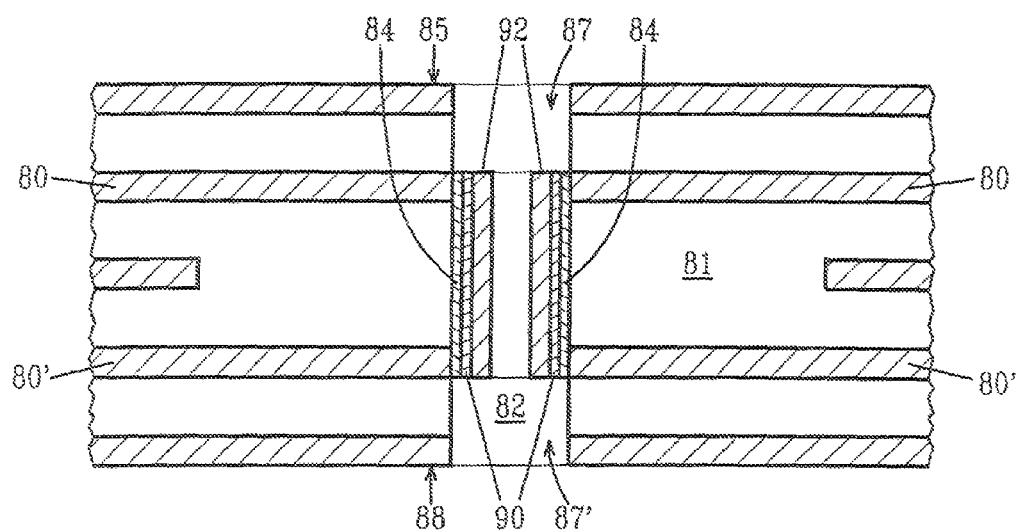
FIG. 5 is a schematic representation of a PCB of the invention.

In addition, because the process can be practiced on both sides of a PCB (as shown in FIG. 5) the insulator diameter of the through-hole proximate to an opposite external planar surface 88 of the printed circuit board is substantially equal to the insulator diameter of the through-hole between the two interconnect lines 80 and 80'. Also, the outermost interior surface 87' of the through-hole proximate to the opposite external planar surface 88 of the printed circuit board consists essentially of an insulating surface.

The PCB can also include a first copper layer 90 on a seed layer 84, which is typically a copper layer formed by an electroless process, FIG. 5. The first copper layer 90 is typically followed by a second copper layer 92, which is typically a copper layer formed by an electrolytic plating process.

The invention is also directed to a PCB comprising at least one embedded copper interconnect line and two external insulating layers opposite one another. Each of the external insulating layers include an external interconnect line disposed within the external insulating layer. Also, the embedded interconnect line and the external interconnect lines intersect a common through-hole. An inner seed layer is disposed in the common through-hole from the embedded interconnect line to one of the two external interconnect lines. The insulator diameter of the through-hole is substantially equal throughout, however, one outermost surface of the through-hole proximate to one of the two external insulating layers of the printed circuit board consists essentially of an insulating surface.

Again, the PCB can also include a first copper layer on the inner seed layer, which is typically a copper layer formed by an electroless process. The first copper layer is typically followed by a second copper layer on the first copper layer, which is typically a copper layer formed by an electrolytic plating process. As a result, the PCB includes a copper contact between the embedded interconnect line and only one of the two external interconnect lines.

The invention is also directed to a PCB comprising at least two internal insulating layers and a plurality of copper interconnect lines embedded in the internal insulating layers, and a plurality of through-holes comprising at least two copper lands such that each of the at least two copper lands is associated with at least two of the plurality of embedded copper interconnect lines. The PCB also comprises a copper conductor disposed between the copper lands such that the copper conductor comprises a first copper layer of electroless applied copper and a second copper layer of electrolytic plated copper, and two external insulating layers such that the insulator diameter of the through-hole of the external insulating layers is substantially equal to the insulator diameter of the through-hole between the embedded interconnect lines. The PCB also comprises an interior surface of the through-hole associated with each external insulating layer that consists essentially of an insulating surface. This PCB is represented by FIG. 5.

The invention is also directed to a PCB comprising at least one embedded copper interconnect line and at least one external copper interconnect line disposed within an external insulating layer. The embedded interconnect line and the external interconnect line intersect a common through-hole. The common through-hole includes an inner seed layer that extends from the embedded interconnect line to the external interconnect line. The PCB includes an opposite external insulating layer that intersects the common through hole. However, the insulator diameter of the through-hole of the opposite external insulating layer is substantially greater than the insulator diameter of the through-hole between the embedded interconnect line and external interconnect line. The PCB also includes an outermost surface proximate to the opposite external insulating layer of the printed circuit board. This outermost surface intersects the common through-hole and consists essentially of an insulating surface.

As with the other PCBs described above, the PCB can also include a first copper layer on the inner seed layer. Typically, the first copper layer is an electroless applied copper layer. A second copper layer can then be applied to the first copper layer. Typically, the second copper layer is an electrolytic plated copper layer.

The PCB can also include a through-hole from the embedded copper interconnect line to the opposite external insulating layer. In this case, the through-hole will have a greater insulator diameter in the portion between the embedded copper interconnect line and the opposite external insulating layer with no copper on that portion of the through-hole.

We claim:

1. A printed circuit board comprising:
    at least one embedded copper interconnect line and at least one external copper interconnect line disposed within an external insulating layer, wherein the embedded interconnect line and the external interconnect line intersect a common through-hole;
    an inner seed layer disposed in the common through-hole from the embedded interconnect line to the external interconnect line,
    an opposite external insulating layer, wherein the insulator diameter of the through-hole of said opposite external insulating layer is substantially greater than the insulator diameter of the through-hole between the embedded interconnect line and external interconnect line; and
    an outermost surface of the through-hole proximate to the opposite external insulating layer of the printed circuit board consists essentially of an insulating surface.

2. The printed circuit board according to claim 1, further comprising a first copper layer on the inner seed layer, wherein the first copper layer is an electroless applied copper layer, and a second copper layer on the first copper layer, wherein the second copper layer is an electrolytic plated copper layer.

3. The printed circuit board according to claim 1, further comprising a through-hole from the embedded copper interconnect line to the opposite external insulating layer, said through-hole having a greater insulator diameter in the portion between the said embedded copper interconnect line and the opposite external insulating layer with no copper on said portion of said through-hole.

4. A structure comprising:
    a plurality of electronic components; and
    a printed circuit board,
    wherein said plurality of electronic components are electronically connected to said printed circuit board,
    wherein said printed circuit board electrically interconnects said plurality of electronic components, and
    wherein said printed circuit board comprises:
        at least two copper interconnect lines separated by an insulator in a vertical direction;
        a through-hole provided in the printed circuit board in the vertical direction such that the at least two interconnect lines provide a copper land in the through-hole;
        a portion of an external insulating layer removed about a circumferential region of the through-hole;
        a seed layer applied to an interior surface of the through-hole;
        an outermost portion of the seed layer removed from the interior surface of the through-hole with a laser; and
        copper applied on the seed layer.

5. The structure of claim 4 wherein the applied copper includes an electroless process to form a first copper layer on the interior surface of the through-hole, and a second copper layer applied on the first copper layer.

6. The structure of claim 4 wherein the external insulating layer is removed by a high power laser or by backdrilling.

7. A process comprising:
    providing a plurality of electronic components;
    providing a printed circuit board with at least two copper interconnect lines separated by an insulator in a vertical direction, and an external insulating layer covers an external surface of the at least two copper interconnect lines;
    providing a through-hole in the printed circuit board in the vertical direction such that the copper interconnect lines provide a copper land in the through-hole;
    applying a seed layer to an interior surface of the through-hole;
    removing an outermost portion of the seed layer from the interior surface of the through-hole with a laser;
    applying copper on the seed layer; and
    removing a portion of the external insulating layer about a circumferential region of the through-hole with a high power laser to the copper land prior to the applying of the seed layer,
    wherein a portion of the external surface of the at least two copper internal line is exposed and the diameter of the removed portion of the external insulating layer is larger than the diameter of the through hole; and
    disposing said plurality of electronic components in electrical connection to said printed circuit board to electronically interconnects said plurality of electronic components.

8. The process of claim 7 wherein the applying copper includes an electroless process to form a first copper layer on the interior surface of the through-hole, and applying a second copper layer on the first copper layer.

9. The process of claim 7 wherein the outermost portion of the seed layer removed from the through-hole extends from an external planar surface of the printed circuit board to the copper land of one of the at least two interconnect lines.

10. The process of claim 7 wherein the laser comprises a catadioptric lens.

11. The process of claim 7 wherein the outermost portions of the seed layer removed from the through-hole extends from an external planar surface of the printed circuit board to the copper land of one of the interconnect lines, and from an opposite external planar surface of the printed circuit board to the copper land of another interconnect line positioned in the through-hole.

12. The process of claim 7 further comprising removing an outer edge portion of the printed circuit board to expose at least one of the two interconnect lines at a kerf area, thereby allowing electrical contact to be made to these embedded copper lines for electroplating of the through-holes.

13. A process comprising: providing a plurality of electronic components;
   providing a printed circuit board; providing a printed circuit board with at least two copper interconnect lines separated by an insulator in a vertical direction, and an external insulating layer covers an external surface of the at least two copper interconnect lines;
   providing a through-hole in the printed circuit board in the vertical direction such that the at least two copper interconnect lines provide a copper land in the through-hole;
   wherein a portion of the external surface of the at least two copper internal line is exposed and the diameter of the removed portion of the external insulating layer is larger than the diameter of the through hole; then;
   removing a portion of an the external insulating layer about a circumferential region of the through-hole;
   applying a seed layer to an interior surface of the through-hole;
   removing an outermost portion of the seed layer from the interior surface of the through-hole with a laser;
   applying copper on the seed layer; and
   disposing said plurality of electronic components in electrical connection to said printed circuit board to electronically interconnects said plurality of electronic components.

14. The process of claim 13 wherein the applying copper includes an electroless process to form a first copper layer on the interior surface of the through-hole, and applying a second copper layer on the first copper layer.

15. The process of claim 13 wherein the external insulating layer is removed by a high power laser or by backdrilling.

\* \* \* \* \*